(12) United States Patent
Yamaguchi et al.

(10) Patent No.: US 6,890,617 B1
(45) Date of Patent: May 10, 2005

(54) POROUS ADHESIVE SHEET, SEMICONDUCTOR WAFER WITH POROUS ADHESIVE SHEET, AND METHOD OF MANUFACTURE THEREOF

(75) Inventors: Miho Yamaguchi, Ibaraki (JP); Yuji Hotta, Ibaraki (JP)

(73) Assignee: Nitto Denko Corporation, Osaka (JP)

( * ) Notice: Subject to any disclaimer, the term of this patent is extended or adjusted under 35 U.S.C. 154(b) by 0 days.

(21) Appl. No.: 10/181,020

(22) PCT Filed: Aug. 18, 2000

(86) PCT No.: PCT/JP00/05553

§ 371 (c)(1),
(2), (4) Date: Jul. 12, 2002

(87) PCT Pub. No.: WO01/51580

PCT Pub. Date: Jul. 19, 2001

(30) Foreign Application Priority Data

Jan. 13, 2000 (JP) ........................................ 2000-005084
Aug. 10, 2000 (JP) ........................................ 2000-243398

(51) Int. Cl.[7] ................................................ B32B 3/10
(52) U.S. Cl. ........................ 428/131; 428/901; 428/343; 428/355 R; 174/264; 174/262
(58) Field of Search ................................ 428/901, 131, 428/343, 355; 174/264, 262

(56) References Cited

U.S. PATENT DOCUMENTS

| 4,346,700 | A | | 8/1982 | Dunshee et al. |
|---|---|---|---|---|
| 4,404,243 | A | | 9/1983 | Terpay |
| 4,666,751 | A | | 5/1987 | Pasquali et al. |
| 4,806,111 | A | * | 2/1989 | Nishi et al. .................. 439/109 |
| 5,093,202 | A | * | 3/1992 | Mariaggi et al. ............ 428/414 |
| 5,300,618 | A | * | 4/1994 | Durairaj ...................... 528/101 |
| 5,435,480 | A | * | 7/1995 | Hart et al. ................. 228/180.1 |
| 5,576,518 | A | * | 11/1996 | Shibuya et al. .............. 174/264 |
| 5,604,026 | A | | 2/1997 | King |
| 6,075,080 | A | * | 6/2000 | Katsuoka et al. ............ 524/272 |
| 6,121,553 | A | * | 9/2000 | Shinada et al. .............. 174/259 |
| 6,245,175 | B1 | * | 6/2001 | Hotta et al. .................. 156/172 |

FOREIGN PATENT DOCUMENTS

| EP | 0560072 A | 9/1993 | |
|---|---|---|---|
| EP | 560072 A2 * | 9/1993 | ........... H01L/21/48 |
| WO | WO 97/33946 A | 9/1997 | |

* cited by examiner

*Primary Examiner*—Terrel Morris
*Assistant Examiner*—Hai Vo
(74) *Attorney, Agent, or Firm*—Sughrue Mion, PLLC

(57) ABSTRACT

A porous adhesive sheet 1 having plural through holes 2 running in about parallel with each other in the thickness direction A of an adhesive organic film 3, wherein the through holes have about congruent sections in the diameter direction from one opening 2a to the other opening 2b and a production method thereof, and a semiconductor wafer with a porous adhesive sheet 31, which includes a semiconductor wafer 32 having an electrode 33, the porous adhesive sheet 1 adhered to the semiconductor wafer, and a conductive part 34 formed by filling a through hole 2 located on the electrode 33 with a conductive material, and a production method thereof are provided.

4 Claims, 6 Drawing Sheets

US 6,890,617 B1

POROUS ADHESIVE SHEET, SEMICONDUCTOR WAFER WITH POROUS ADHESIVE SHEET, AND METHOD OF MANUFACTURE THEREOF

TECHNICAL FIELD

The present invention relates to a porous adhesive sheet, particularly a porous adhesive sheet that can be suitably used as an adhesive material for mounting a semiconductor, and a preferable production method thereof. The present invention also relates to a semiconductor wafer with the above-mentioned porous adhesive sheet, and a preferable production method thereof.

BACKGROUND ART

As a method of semiconductor mounting capable of achieving higher productivity, a bare chip mounting has been developed, wherein a semiconductor element having a bump and a substrate are joined and the space between them is filled with an underfill material by immersion and the like. In such bare chip mounting, an electrode on a semiconductor element is formed into a convex shape (bump) using, for example, a soldering paste, and this bump is metal joined with a circuit on a substrate and the gap between the semiconductor element and the substrate (other than the bump) is filled with an underfill material to form a bump junction.

A semiconductor element mounted by this method, however, easily suffers from the stress produced by the difference in the expansion coefficients of the substrate and the semiconductor element, often resulting in a defective bump junction. In this event, a greater distance between the semiconductor element and the substrate during the above-mentioned junction reduces the stress produced by the difference in the expansion coefficients of the substrate and the semiconductor element. However, a greater distance between the semiconductor element and the substrate requires a greater diameter of the bump to match the distance, thus making a fine-pitch connection difficult to achieve.

Because the underfill material comprises a liquid resin for adhesion, the fluidity of the adhesive material needs control. Thus, the development of an adhesive material capable of simple adhesion is desired to replace the liquid resin.

As a different method for semiconductor mounting, a method is known, wherein a semiconductor element and a circuit board are adhered using an anisotropic conductive film to achieve conduction. When compared with the above-mentioned method for forming a bump junction, however, the connection resistance becomes higher. Therefore, when this method is used for a high speed semiconductor device, many problems occur, such as heat generation in a semiconductor element, noise signal during operation and the like.

To obviate these defects, the present inventors conceived an idea of adhering, to a semiconductor wafer, a porous adhesive sheet generally used for adhering a filter and the like to secure gas permeation, filling part of the through holes in the porous adhesive sheet with a soldering paste to electrically connect the semiconductor element and one side of the porous adhesive sheet, forming a bump on one side of the porous adhesive sheet to connect the circuit side of the substrate, thereby to improve connection reliability with the circuit side. As a porous adhesive sheet usable for such semiconductor mounting, one having through holes of a regular shape, which are hardly closed in an adhesion state, is preferable.

When a production method comprising forming a number of fine through holes in a formed adhesive sheet to give a porous adhesive sheet is employed, a resin, which is a sheet material, flows during adhesion and fills the through holes, failing the conduction.

When a production method of a porous adhesive sheet is employed, which comprises extending a formed organic film to give an adhesive sheet and forming a number of fine through holes, moreover, respective through holes thus formed do not have a regular shape. When the organic film itself has adhesiveness that allows adhesion by heating and/or pressurization, the opening of some of the through holes is easily closed up during adhesion, and the opening ratio of the porous adhesive sheet drastically decreases before and after the adhesion. With such production method, formation of through holes such that the porous adhesive sheet has such opening ratio as to achieve the object is difficult.

The present inventors assumed the following processes for forming a number of fine through holes in an organic film. These methods provide through holes having a regular shape, but each has the following problems.

(1) Drilling
Due to low productivity, unsuitable for the production of a porous adhesive sheet having a number of fine through holes.

(2) Punching
Incapable of forming fine through holes, unsuitable for production of the above-mentioned porous adhesive sheet.

(3) Laser Beam Machining
A porous adhesive sheet wherein each through hole has an about trapezoid shape is produced, due to which the opening ratio (area ratio of opening of through holes to the entire porous adhesive sheet) of one surface of one side differs greatly from that of one surface of the other side upon formation of the through holes. In this porous adhesive sheet, the ratio of the minimum area Smin to the maximum area Smax, Smin/Smax (%), of the sections in the diameter direction from one opening to the other opening of a through hole is 40%–80%, wherein the area permitting adhesion on the side having a greater opening ratio becomes smaller than that on the side having a smaller opening ratio. This has a consequence that the side having a greater opening ratio of the adhesive sheet fails to have adhesiveness permitting its adhesion to an adhesion target.

(4) Photoprocessing
As in the case of laser beam machining, each through hole has an about trapezoid shape. In this porous adhesive sheet, the ratio of the minimum area Smin to the maximum area Smax, Smin/Smax (%), of the sections in the diameter direction from one opening to the other opening of a through hole is 40%–80%. As a result, a porous adhesive sheet wherein the opening ratio differs greatly between one surface of one side and one surface of the other side is unpreferably produced.

The present invention aims at solving the above-mentioned problems and provides the following.
(1) A porous adhesive sheet suitably used also in the field of electronic materials.
(2) A suitable production method of the adhesive sheet of the above-mentioned (1) (e.g., a porous adhesive sheet having through holes having a regular shape and difficult to close in an adhesion state.
(3) A semiconductor wafer with a porous adhesive sheet, which is suitable for bare chip mounting, and a suitable production method thereof.

DISCLOSURE OF THE INVENTION

The present inventors have conducted intensive studies in an attempt to solve the above-mentioned problems and found that a porous adhesive sheet free of the abovementioned problems can be obtained by employing a specific structure and/or a specific production method, that this porous adhesive sheet is highly preferable as an adhesive material for bare chip mounting, and that production of a semiconductor wafer with a porous adhesive sheet can further improve its productivity, which resulted in the completion of the present invention.

Accordingly, the present invention provides the following.

[1] An adhesive sheet having plural through holes running in about parallel with each other in the thickness direction of an organic film, wherein each through hole has an about congruent section in the diameter direction from one opening thereof to the other opening thereof.

[2] The porous adhesive sheet of the above-mentioned [1], wherein the through hole maintains its opening even after adhesion.

[3] The porous adhesive sheet of the above-mentioned [1], further comprising an organic material layer having a softening temperature higher by 10° C. or more than the softening temperature of the organic film, which layer surrounding the aforementioned through holes.

[4] The porous adhesive sheet of the above-mentioned [1] or [3], which comprises, on at least one side of the organic film, an adhesive material layer having the entirety or a part of the through holes present in the organic film and plural communication holes communicating in the aforementioned thickness direction, wherein the adhesive material layer is composed of a thermoplastic resin or thermosetting polymer having a softening temperature lower than that of the organic film by 10° C.–30° C., and has such thickness as not to close up the through holes in the organic film in an adhesion state.

[5] The porous adhesive sheet of the above-mentioned [1] or [3], which comprises, on at least one side of the organic film, an adhesive material layer having the entirety or a part of the through holes present in the organic film and plural communication holes communicating in the aforementioned thickness direction, wherein the adhesive material layer is composed of a thermosetting oligomer having a melt start temperature lower than the softening temperature of the organic film by not less than 10° C., and has such thickness as not to close up the through holes in the organic film in an adhesion state.

[6] The porous adhesive sheet of any of the above-mentioned [1] to [5], wherein, when at least a part of the through holes is filled with a conductive material, respective conductive materials are insulated from each other.

[7] A production method of a porous adhesive sheet, which comprises a step for forming a wire-containing film for forming an adhesive organic film having plural wires running in about parallel with each other in the thickness direction thereof, and a wire-removing step for removing the wire in said organic film.

[8] The production method of the above-mentioned [7], wherein the wire is covered with an organic material having a softening temperature higher than that of the organic film by not less than 10° C.

[9] The production method of the above-mentioned [7] or [8], further comprising, between the aforementioned step for forming a wire-containing film and the wire-removing step, a wire protrusion step for protruding a wire end on at least one surface side of the wire-containing film from the film surface, and an adhesive material layer-forming step for forming an adhesive material layer composed of a thermoplastic resin or thermosetting polymer having a softening temperature lower than that of the organic film by 10° C.–30° C., which fills a difference between the aforementioned wire protrusion and the film surface.

[10] The production method of the above-mentioned [7] or [8], further comprising, between the aforementioned step for forming a wire-containing film and the wire-removing step, a wire protrusion step for protruding a wire end on at least one surface side of the wire-containing film from the film surface, and a step for forming an adhesive material layer composed of a thermosetting oligomer having a melt start temperature lower than the softening temperature of the organic film by not less than 10° C., which fills a difference between the aforementioned wire protrusion and the film surface.

[11] The production method of any of the above-mentioned [7] to [10], wherein the wires are insulated from each other.

[12] A semiconductor wafer with a porous adhesive sheet, which comprises a semiconductor wafer having at least one electrode on at least one surface thereof, the porous adhesive sheet of the above-mentioned [6], which is adhered to said surface of the semiconductor wafer, and a conductive part formed by filling each through hole located on the electrode of the semiconductor wafer of the porous adhesive sheet with a conductive material.

[13] A production method of a semiconductor wafer with a porous adhesive sheet, which comprises an adhesion step for adhering the porous adhesive sheet of the above-mentioned [6] onto at least one surface of a semiconductor wafer having at least one electrode on at least one surface thereof, and a conductive part-forming step for filling a through hole located on the electrode of the semiconductor wafer of the porous adhesive sheet with a conductive material and joining the electrode and the conductive material.

DETAILED DESCRIPTION OF THE INVENTION

The present invention is described in detail in the following.

Figure 1:
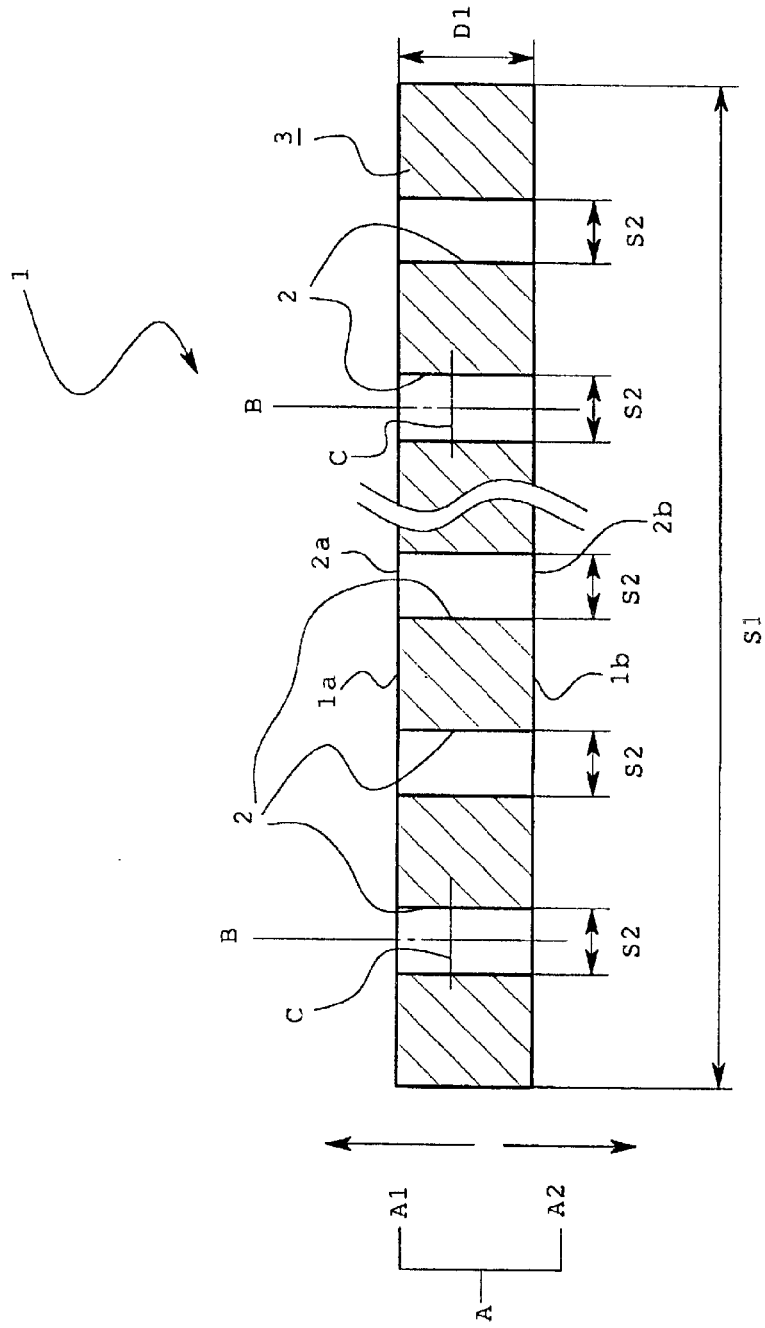
FIG. 1 shows a simplified sectional view of one preferable embodiment of a porous adhesive sheet 1 of the present invention.

FIG. 1 shows a simplified sectional view of one preferable embodiment of a porous adhesive sheet 1 of the present invention. FIG. 1 shows a sectional view on one virtual plane in parallel with the thickness direction A of the porous adhesive sheet 1 and passing a through hole 2. The porous adhesive sheet 1 shown in FIG. 1 is an adhesive organic film 3 having plural through holes 2. The through holes 2 run in about parallel with each other in the thickness direction A of the organic film 3, penetrate the organic film 3 generally along the thickness direction A thereof, and have openings 2a and 2b respectively on one surface 1a of one side A1 of porous adhesive sheet 1 in the thickness direction and on one surface 1b of the other side A2 thereof in the thickness direction. In the present invention, the thickness direction of each of the porous adhesive sheet 1 and the organic film 3 is the same direction A.

While the central axis B of the above-mentioned through hole 2 may be linear or curved, it is preferably linear. The through hole 2 has, from its one opening 2a to the other opening 2b, about congruent sections in the diameter direction. In the present specification, by the "section in the diameter direction" is meant that in a virtual plane C perpendicular to the central axis B of each through hole 2. By the above-mentioned "about congruent" is meant a substantially the same shape. In other words, it means that the shape and area of each section in the diameter direction are the same from one opening 2a to the other opening 2b of through hole 2 in the present invention, including a production error. The above-mentioned production error means that, of the sections in the diameter direction from one opening to another opening of a through hole, the ratio Smin/Smax (%) of the minimum area (Smin) to the maximum area (Smax) is preferably 85%–100%, more preferably 90%–100%. The through hole 2 in the present invention does not include one having a shape about congruent in the aforementioned section in the diameter direction but not almost identically-shaped, namely, a twisted shape.

The shape of the section in the diameter direction of through hole 2 is not particularly limited and is appropriately determined according to the use of the porous adhesive sheet of the present invention. It may be round, square, triangular or other shape, preferably round, more preferably circular. The sectional shape of each through hole 2 in a virtual plane C perpendicular to the central axis B may be about congruent or different from each other. More preferably, through holes 2 are realized to have an about congruent sectional shape. In FIG. 1, every through hole 2 has an about congruent circular sectional shape.

As mentioned above, plural through holes 2 are about parallel with each other, and penetrate the aforementioned organic film 3 generally in the thickness direction A. The aforementioned through holes 2 do not need to be parallel with the thickness direction A of organic film 3, as long as they are about parallel with each other. Preferably, they are parallel with the aforementioned thickness direction A and parallel with each other. When the through holes 2 have the aforementioned sectional shape of an about congruent circle, as shown in FIG. 1, they preferably have a diameter of 18 μm–150 μm, more preferably 30 μm–100 μm. When the through holes 2 have the aforementioned sectional shape other than a circle, they preferably have a similar sectional area as that of the above-mentioned circle.

The porous adhesive sheet 1 has the above-mentioned plural through holes 2 to the extent that the adhesiveness of a practical level is ensured. To be specific, the number of through holes 2 is determined to make the ratio of opening of the porous adhesive sheet 1 at ambient temperature (23° C.) preferably 30%–80%, more preferably 40%–70%. The ratio of opening refers to the proportion of the total of the opening areas S2 of the through holes 2 to area S1 that includes each opening 2a of the through hole 2 on one surface of one side of porous adhesive sheet 1, for example, one surface 1a of one side A1 in the thickness direction.

Different from conventional porous adhesive sheets having through holes formed by laser beam machining or photoprocessing, the porous adhesive sheet 1 has similar ratio of opening of one surface 1a of one side A1 in the thickness direction and that of one surface 1b of the other side A2 in the thickness direction, and adhesiveness of a practically functional level.

The porous adhesive sheet of the present invention may have a structure of a single layer or a laminate. As shown in FIG. 1, when the adhesive sheet 1 includes an organic single layer film 3, the organic single layer film itself needs to have adhesiveness. When it is a laminate, as mentioned below, the outermost layer of at least one side needs to have adhesiveness. In this case, the organic film itself may not have adhesiveness. The porous adhesive sheet 1 has a thickness D1 of preferably 30 μm–500 μm, more preferably 50 μm–300 μm.

When the sheet has a single layer as mentioned above, organic film 3 preferably has adhesiveness that permits adhesion at least by heating, more preferably by heating and pressurization. The material of organic film 3 having such adhesiveness is not particularly limited as long as it is a resin that develops adhesiveness at least by heating, and may be a known adhesive material such as thermoplastic resin, unreacted thermosetting resin composition and the like. As such material, a thermoplastic resin film or thermosetting polymer film obtained by forming these resins, which has a softening temperature of preferably 100° C.–250° C., more preferably 150° C.–200° C., is used. When a material having the above-mentioned softening temperature of lower than 100° C. is used, the adhesive sheet shows degraded adhesion reliability. When a material having the above-mentioned softening temperature of over 250° C. is used, the materials including those around an aluminum electrode on a semiconductor element and the like may be deteriorated or adhesion operability may be degraded. The "softening temperature" in the present specification refers to an inflection point temperature as measured upon temperature increase at 10° C./min on a tension mode of TMA (thermomechanical analysis). The organic film 3 to be used in the present invention particularly preferably becomes adhesive in a temperature range of 105° C.–220° C. by pressurization at 0.49 MPa–2.94 MPa generally in the aforementioned thickness direction. In general, a porous adhesive sheet obtained by forming through holes in the above-mentioned organic film and adhered to an adhesion target at a temperature higher than the softening temperature of the organic film by 5° C.–10° C. suppresses changes in shape of through holes and retains suitable adhesiveness.

The material of the organic film 3, when it is a thermoplastic resin, includes, for example, polyamide resin (softening temperature: 160° C.), polyimide resin (softening temperature: 190° C.), saturated polyester resin (softening temperature: 170° C.) and the like. Of the thermosetting polymers, polycarbodiimide resin is preferable. These resins are determined according to the object and may be used alone or in combination of two or more kinds thereof. The thermosetting resin to be used for organic film 3 shows self-supporting property during film forming and allows measurement of the softening temperature. As used herein, by the "thermosetting polymer" is meant a solid one in what is called a B-stage, which is obtained by polymerization or condensation of an unreacted thermosetting resin composition (monomer) to give a crosslinkable polymer.

The porous adhesive sheet 1 maintains the openings 2a, 2b of through hole 2 even after adhesion of the adhesive sheet to an adhesion subject. Concretely, the openings 2a, 2b show a proportion of decrease from the above-mentioned ratio of opening at an ambient temperature to that after adhesion of preferably 0%–20%, more preferably 0%–10%. Because the porous adhesive sheet 1 shows regularity in the shape of through hole 2, and maintains openings 2a, 2b upon adhesion, the ratio of opening does not change drastically before and after adhesion, thereby retaining sufficient opening in the through holes.

Figure 2:
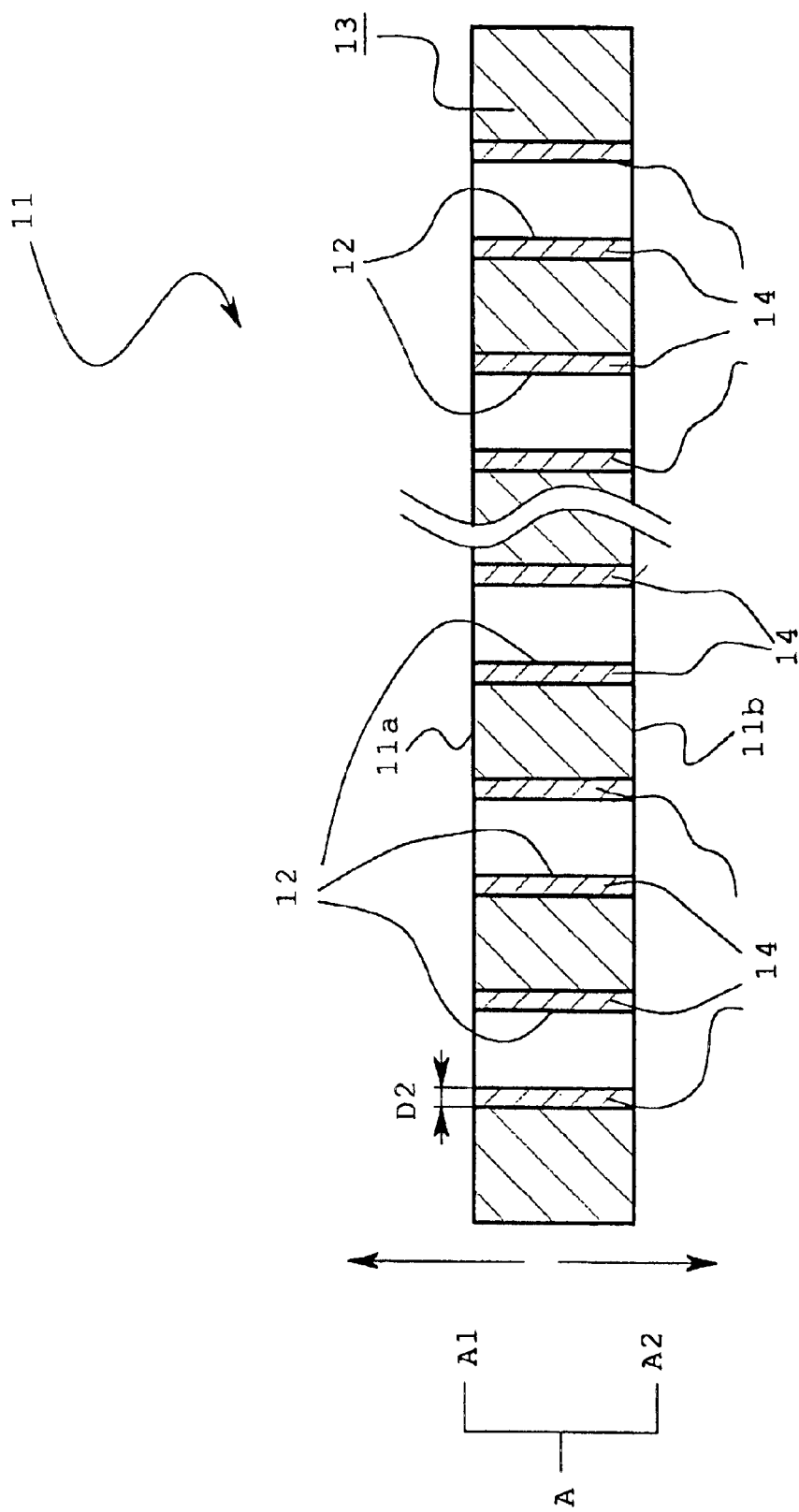
FIG. 2 shows a simplified sectional view of one preferable embodiment of a porous adhesive sheet 11 of the present invention.

The porous adhesive sheet of the present invention preferably has an organic material layer surrounding the aforementioned through holes. FIG. 2 shows a simplified sectional view of one preferable embodiment of a porous adhesive sheet 11 of the present invention, which is on one virtual plane in parallel with the thickness direction A and passing a through hole 12 and organic material layer 14.

The porous adhesive sheet 11 shown in FIG. 2 further has an organic material layer 14 surrounding the through hole 12, in addition to through hole 12 and organic film 13 corresponding to the through hole 2 and the organic film 3 of the porous adhesive sheet 1 shown in FIG. 1.

The organic material layer 14 shows self-supporting property and is produced using an organic material having a softening temperature higher by at least 10° C., preferably at least 30° C., than the thermoplastic resin or thermosetting polymer that forms the organic film 13. As such organic material, one having a softening temperature of preferably not lower than 160° C., more preferably not lower than 170° C., is preferable. Specific examples include polyamideimide resin (softening temperature: 170° C.), saturated polyester resin and the like. An organic material capable of satisfying the above-mentioned requirements upon combination with materials forming the organic film 13 can be used. When an unreacted thermosetting resin composition is used as the organic material forming the organic material layer 14, it is preferable that the composition become a thermoset resin having a three-dimensional structure when the organic material layer 14 has been formed.

As shown in FIG. 2, when the aforementioned sectional shape of respective through holes 12 is about a congruent circle, the organic material layer 14 is preferably formed in a cylindrical shape having a concentric circle with through hole 12. The thickness D2 then of the organic material layer 14, or the linear distance between the outer periphery and the inner periphery on a visual linear line extending in the radial direction is preferably 1 $\mu$m–10 $\mu$m, more preferably 2 $\mu$m–8 $\mu$m.

Such organic material layer 14 has a softening temperature higher than the softening temperature of the organic film 13. Therefore, when the above-mentioned organic film 13 is softened by heating to permit adhesion, the organic material layer 14 does not transit to a softened state any more easily than the organic film 13 does. When compared with a case where such organic material layer is not formed, the shape of the through hole 12 can be easily retained. This has a consequence that the porous adhesive sheet 11 affords, besides the above-mentioned effects of the porous adhesive sheet 1 shown in FIG. 1, an effect that the opening of the through hole 12 is not easily closed up, and the decrease in the ratio of opening before and after adhesion can be minimized. In addition, the through hole does not easily deform as a whole, thereby providing a high grade porous adhesive sheet 11 permitting more functional use of the through hole.

Figure 3:
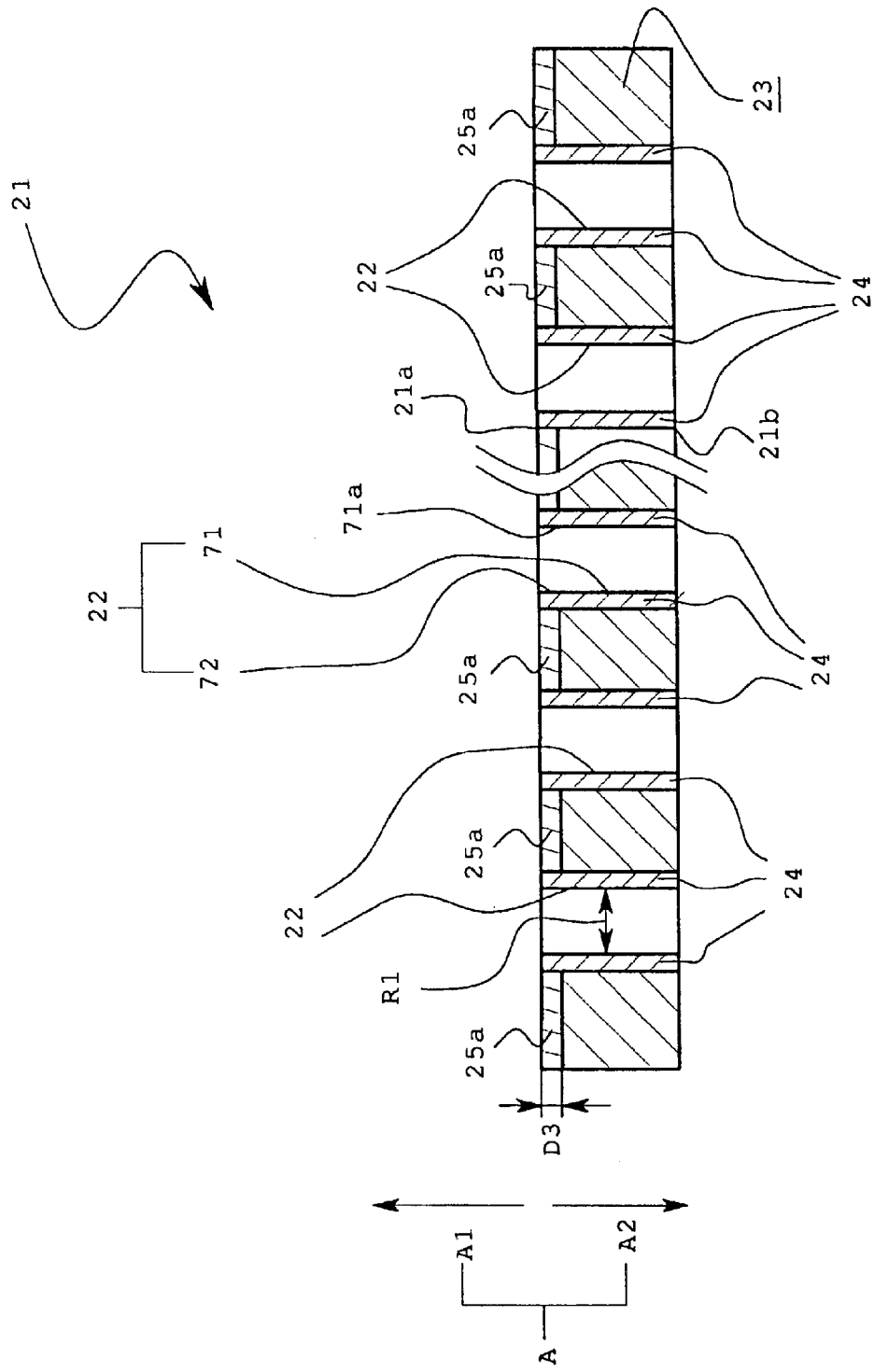
FIG. 3 shows a simplified sectional view of one preferable embodiment of a porous adhesive sheet 21 of the present invention.

The porous adhesive sheet of the present invention preferably has an adhesive material layer on at least one surface of the organic film. The adhesive material layer has a communicating hole that communicates with the entirety or a part of the through holes in the organic film in the above-mentioned thickness direction. FIG. 3 shows a simplified sectional view of one preferable embodiment of a porous adhesive sheet 21 of the present invention, which is on one virtual plane in parallel with the thickness direction A and passing a through hole 22 and an adhesive material layer 25a.

The porous adhesive sheet 21 shown in FIG. 3 further has an adhesive material layer 25a that forms a region excluding an organic material layer 24 on one surface 21a of one side A1 in the thickness direction of the porous adhesive sheet 21, in addition to the through hole 71, an organic film 23 and an organic material layer 24 corresponding to the through hole 12 and the organic film 13 and organic material layer 14 of the porous adhesive sheet 11 shown in FIG. 2. Thus, the porous adhesive sheet 21 of FIG. 3 is produced from a laminate of an organic film 23 and an adhesive material layer 25a. The porous adhesive sheet 21 has a through hole 22 consisting of a through hole 71 in the organic film 23 and a communicating hole 72 that communicates with the through hole 71 in the above-mentioned thickness direction A in this adhesive material layer 25a. The communication hole 72 has about congruent sections in the diameter direction with the through hole 71 and continuously ranges with the same axis line. In other words, in the porous adhesive sheet 21 of FIG. 3, as in the case of the aforementioned embodiments, the through hole 22 is produced to have about congruent sections in the diameter direction from its one opening to the other opening.

The adhesive material layer 25a is produced from a thermoplastic resin, thermosetting polymer or thermosetting oligomer. When the adhesive material layer 25a is produced from a thermoplastic resin or thermosetting polymer, one having a softening temperature lower than that of the organic film 23 by 10° C.–30° C. is used. When the adhesive material layer 25a is produced from a thermosetting oligomer, one having a melt start temperature lower than the softening temperature of the organic film 23 by at least 10° C. is used. As regards the thermosetting resin in the present specification, the "unreacted thermosetting resin" refers to those in what is called the A-stage, the "thermosetting oligomer" refers to, from among those in what is called the B-stage, a semi-solid one that permits measurement of the melt start temperature and does not permit measurement of the softening temperature, and the "thermosetting polymer" refers to, from among those in what is called the B-stage, a solid one that permits measurement of the softening temperature. The "thermoset resin" in the present specification refers to a cured product in what is called the C-stage, where the thermosetting resin has been heat cured to have a three-dimensional structure. In the present specification, a mere reference to a "thermosetting resin" includes the above-mentioned "unreacted thermosetting resin", "thermosetting oligomer" and "thermosetting polymer". In the present specification, the "melt start temperature" refers to, when the above-mentioned adhesive material is melted using DSC (differential scanning calorimeter), a temperature at the point at which the tangent line toward said point intersects with the base line, from among the respective points on the peak, obtained in response to the above-mentioned melting, on the differential calorimetric curve obtained by the melting.

When a thermosetting resin is applied, a liquid unreacted thermosetting resin composition containing a base resin and a curing agent is generally used. After applying this composition and the like, the reaction is carried out under an appropriate control by heating and the like, whereby a thermosetting oligomer permitting measurement of a melt start temperature can be obtained. The thermosetting oligomer has a softening temperature of not higher than the ambient temperature, and does not permit determination of the softening temperature. In the present specification, therefore, the "melt start temperature" is set for the thermosetting oligomer as mentioned above, which corresponds to the "softening temperature" of a thermosetting polymer and a thermoplastic resin.

The thermosetting polymer and the thermoplastic resin that afford a softening temperature also permit determination of the melt start temperature in the above-mentioned manner. A porous adhesive sheet having an adhesive material layer produced from an adhesive material having a softening temperature and a melt start temperature both lower than the softening temperature of the organic film by 10° C.–30° C. is also encompassed in the present invention.

An adhesive material to produce such adhesive material layer when a thermosetting polymer or thermoplastic resin is used has a softening temperature of preferably 120° C.–240° C., more preferably 15° C.–200° C., particularly preferably 160° C.–190° C. A thermosetting polymer or thermoplastic resin showing such a softening temperature is, for example, a saturated polyester resin (softening temperature: 170° C.), a polyamide resin (softening temperature: 160° C.), a polycarbodiimide resin and the like. When a thermosetting oligomer is used, the melt start temperature thereof is not higher than 170° C., more preferably not higher than 150° C., particularly preferably not higher than 120° C. As a thermosetting oligomer having such a melt start temperature, there is mentioned a semi-solid one obtained by heating an unreacted liquid epoxy resin composition or by other method. Such adhesive material is not particularly limited as long as the above-mentioned requirements are met, and those capable of satisfying the above-mentioned requirements upon combination with materials forming the organic film 23 can be used. Particularly, a thermosetting oligomer of the above-mentioned epoxy resin is preferably used.

The adhesive material is generally liquid during formation of the layer, whether a thermoplastic resin, a thermosetting polymer or a thermosetting oligomer is used. Therefore, when the adhesive material layer is too thick, the adhesive material bleeds out to possibly close up the opening of the through hole 22. Thus, the adhesive material layer 25a should be formed such that the opening of the through hole 22 is not closed, in consideration of adhesion conditions, viscosity and thickness. Particularly, when a thermosetting oligomer is used, viscosity easily decreases during thermal adhesion, and careful processing is required including the determination of the adhesion conditions. As in the above-mentioned case where a porous adhesive sheet is realized with a laminate, at least the adhesive material layer, which is the outermost layer, of the porous adhesive sheet should have adhesiveness, and the organic film itself does not need to have adhesiveness.

The adhesive material layer 25a has a thickness D3 in the aforementioned thickness direction A, such that the through hole 22 is not closed when the organic film 23 is adherable. Such thickness D3 of the adhesive material layer 25a is, like the porous adhesive sheet 21 shown in FIG. 3, for example, 1%–10%, preferably 5%–10%, of the diameter R1 of the through hole 22 when the aforementioned sectional shape of the through hole 22 is an about congruent circle.

Such adhesive material layer may not be formed on the entirety of at least one surface of the organic film less the opening of each through hole and the organic material layer. Preferably, as shown in FIG. 3, it is formed on at least one surface of the porous adhesive sheet 21 less the opening 71a of each through hole 71 and the organic material layer 24.

The porous adhesive sheet 21 having such adhesive material layer 25a can provide the above-mentioned effects of the porous adhesive sheet 11 of FIG. 2, and can improve the adhesiveness of the porous adhesive sheet surface 21a of the adhesive material layer 25a. Forming such adhesive material layer here is considered to make each through hole easily filled after adhesion. However, because the adhesive material layer has a given thickness to suppress such disadvantages, and because an organic material layer is formed around the through hole, the through hole does not collapse easily, and the ratio of opening does not drastically decrease before and after adhesion. Therefore, a porous adhesive sheet having improved adhesiveness and a higher grade can be provided as compared to a structure free of an adhesive material layer.

Alternatively, the porous adhesive sheet of the present invention may not have an organic material layer formed around the through hole but an adhesive material layer may be formed on at least one surface of the porous adhesive sheet except the opening of through holes.

The porous adhesive sheet of the present invention shows insulating property wherein respective conductive materials are insulated from each other, when at least a part of the through holes is filled with a conductive material. The porous adhesive sheets 1, 11 and 21 of the above-mentioned FIG. 1–FIG. 3 all have the above-mentioned insulating property. By the aforementioned state of being "insulated from each other" is meant a state where respective conductive materials are not conducted with each other but insulated from each other within an organic film. As the material to produce an organic film of the porous adhesive sheet having such insulating property, the aforementioned materials are suitable, and a linear distance between through holes is preferably 1 $\mu$m–30 $\mu$m, particularly preferably 5 $\mu$m–20 $\mu$m. In the case of the porous adhesive sheets 11 and 21, each of the organic material layers 14 and 24 is preferably produced from a material having insulating property. As the organic material to produce an organic material layer having such insulating property, all the aforementioned materials are preferable.

In the porous adhesive sheet of the present invention further having such insulating property, an electrode of a semiconductor element can be conducted by filling at least a part of the through holes with a conductive material, such as soldering paste and the like, and adhering the sheet to a semiconductor element having an electrode. As such, the porous adhesive sheet of the present invention can be suitably used for adhesion accompanying electrical connection for wafer scale chip size package, by adhering the sheet to a semiconductor wafer and dividing the sheet into small pieces to give semiconductor elements with a small piece porous adhesive sheet adherable to a substrate. Alternatively, when a high thermal conductive material, such as a silver paste and the like, is used to fill a part of the through holes, the sheet can be beneficially used as a high thermal dissipative adhesive sheet, and the sheet can be beneficially used as a low dielectric adhesive sheet when the through holes remain open. In the present specification, the porous adhesive sheet includes those having a through hole filled up, and a sheet having all through holes filled up is also regarded a porous adhesive sheet.

Figure 4:
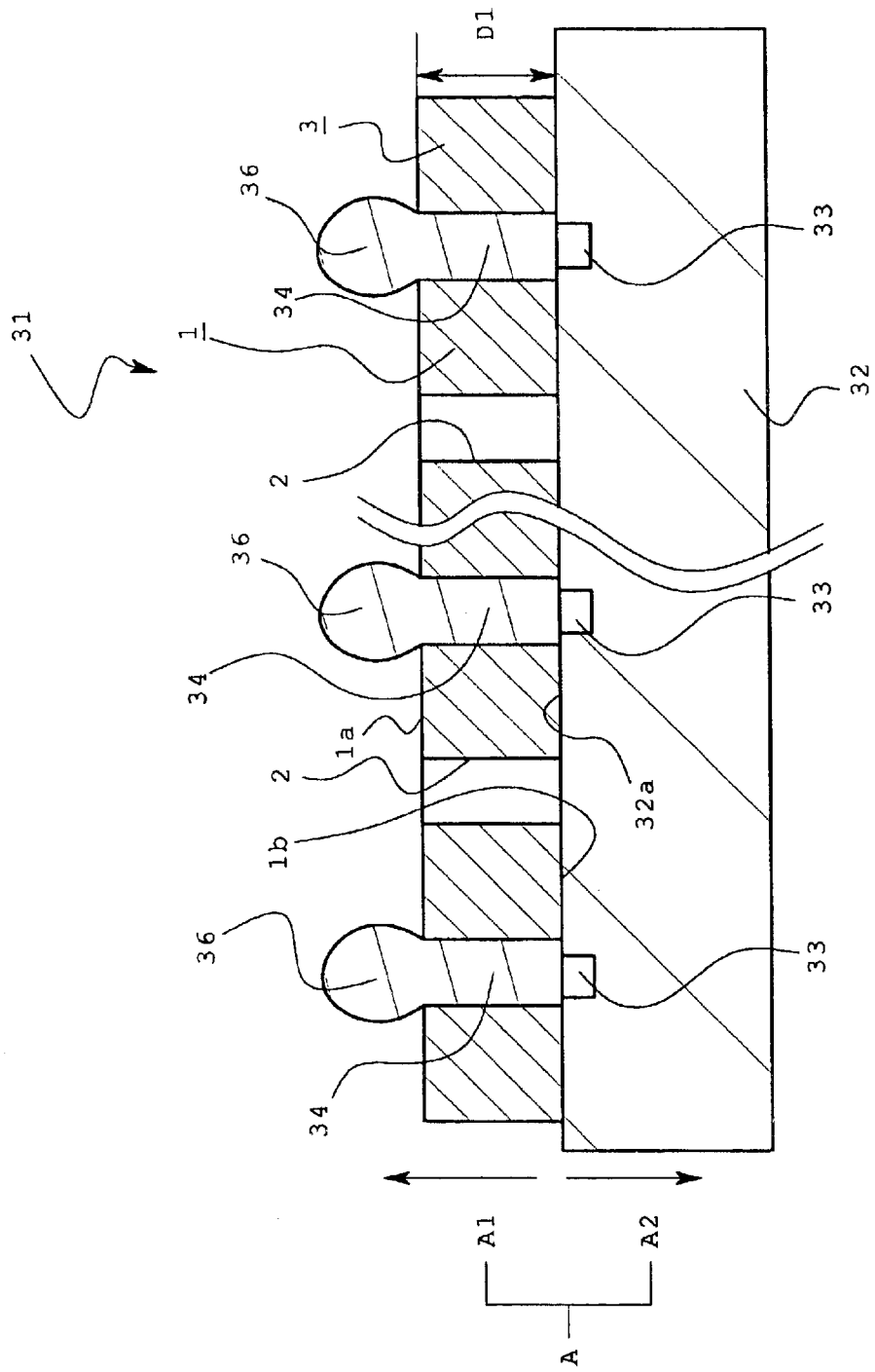
FIG. 4 shows a simplified sectional view of one preferable embodiment of a semiconductor wafer with a porous adhesive sheet 31 of the present invention.

FIG. 4 shows a simplified sectional view of one preferable embodiment of a semiconductor wafer with a porous adhesive sheet 31 of the present invention, which is on one virtual plane in parallel with the thickness direction A and passing a through hole 2 and an electrode 33. For simplification, the size of the semiconductor wafer and that of the porous adhesive sheet are not on the same scale. A porous adhesive sheet having the above-mentioned insulating property can be used beneficially as a material for bare chip mounting. The aforementioned bare chip mounting refers to a method of mounting a semiconductor, which comprises placing an adhesive material on a semiconductor wafer in advance, processing the laminate into small pieces and using the pieces for mounting. A semiconductor wafer with a porous adhesive sheet of the present invention comprises a semiconductor wafer having one or more electrodes on at least one surface thereof, a porous adhesive sheet to be adhered to one surface of the semiconductor wafer, and a conductive part formed by filling a through hole in a porous adhesive sheet, which is located on the electrode of the semiconductor wafer, with a conductive material. In FIG. 4, a semiconductor wafer with a porous adhesive sheet 31 is shown, wherein a porous adhesive sheet 1 shown in FIG. 1 is adhered to one side surface 32a of the semiconductor wafer 32, on which plural electrodes 33 are formed, and, of the plural through holes 2 in the porous adhesive sheet 1, at least the through hole 2 that comes on the electrode 33 of semiconductor wafer 32 is filled with a conductive material to form a conductive part 34.

The conductive parts 34 of a semiconductor wafer with a porous adhesive sheet 31 are insulated from each other in an organic film 3 having insulating property. The conductive material to fill each through hole 2 located on each of the above-mentioned electrodes 33 is not particularly limited as long as it is a metal used for electronic material, but it is preferably a soldering paste. Each conductive part 34 is formed by screen printing, for example, a soldering paste on the through hole located at the position where conduction is desired, and heat-treating same to fill the through hole with the soldering paste, and the metal joined with the electrode of a semiconductor wafer. The aforementioned each conductive part 34 has a bump 36 on the opposite end from the side where the porous adhesive sheet 1 is adhered to a semiconductor wafer 32. The bump 36 is, as shown in FIG. 4, formed in a ball shape protruding to form a convex on one side A1 of porous adhesive sheet 1 in the thickness direction. Such bump 36 can be formed by controlling the thickness of conductive part 34 during the above-mentioned screen printing, or by again applying screen printing and heat treatment.

The porous adhesive sheet 1 shown in FIG. 1 is free of the need for a control of the fluidity of the adhesive material, unlike the conventional underfill materials wherein the space between a semiconductor element and a substrate is filled with a liquid resin for bare chip mounting to adhere them, and therefore, can be used to form a semiconductor wafer with a porous adhesive sheet 31 shown in FIG. 4 by simply adhering not only a semiconductor element but also a semiconductor wafer 32. By dividing such semiconductor wafer with a porous adhesive sheet 31 into small pieces, a semiconductor element with a small size porous adhesive sheet, which has a conductive part 34 on the electrode 33, can be produced. This semiconductor element can be suitably adhered to a substrate and the like on the surface of the small size porous adhesive sheet, which is opposite from the adhesion surface to a semiconductor element (aforementioned surface 1a of one side A1 in the thickness direction in FIG. 4).

The above-mentioned semiconductor element with a small size porous adhesive sheet has a bump 36 at the tip of the conductive part 34. The bump 36 is formed in a ball shape on the end of each conductive part 34 that stands generally perpendicularly from the electrode 33 of the semiconductor element in the thickness D1 of the porous adhesive sheet 1. When the semiconductor element is adhered to a substrate, the semiconductor element and the substrate do not need to be adhered in the entirety, unlike the case of conventional underfill materials. Due to the presence of bump 36, the distance between the semiconductor element and the substrate can be sufficiently ensured via the bump 36. Therefore, occurrence of defective connection due to the different expansion coefficients of the semiconductor element and the substrate can be prevented.

When only the through hole 2 located on the electrode 33 of the semiconductor wafer 32, from among the through holes 2, is filled with a conductive material to form a conductive part 34, cavity through holes 2 come to exist between the semiconductor element and the substrate. This enables adhesion of a semiconductor element having superior dielectric property to a substrate. When, after adhesion of a porous adhesive sheet 1 to a semiconductor wafer 32, a through hole 2 not located on the electrode 33 is filled with an adhesive material, a low elastic material, a low linear expansive material and the like as necessary, a semiconductor wafer with a porous adhesive sheet, which shows adhesiveness, low elasticity, low linear expansion property and the like, can be produced.

Figure 5:
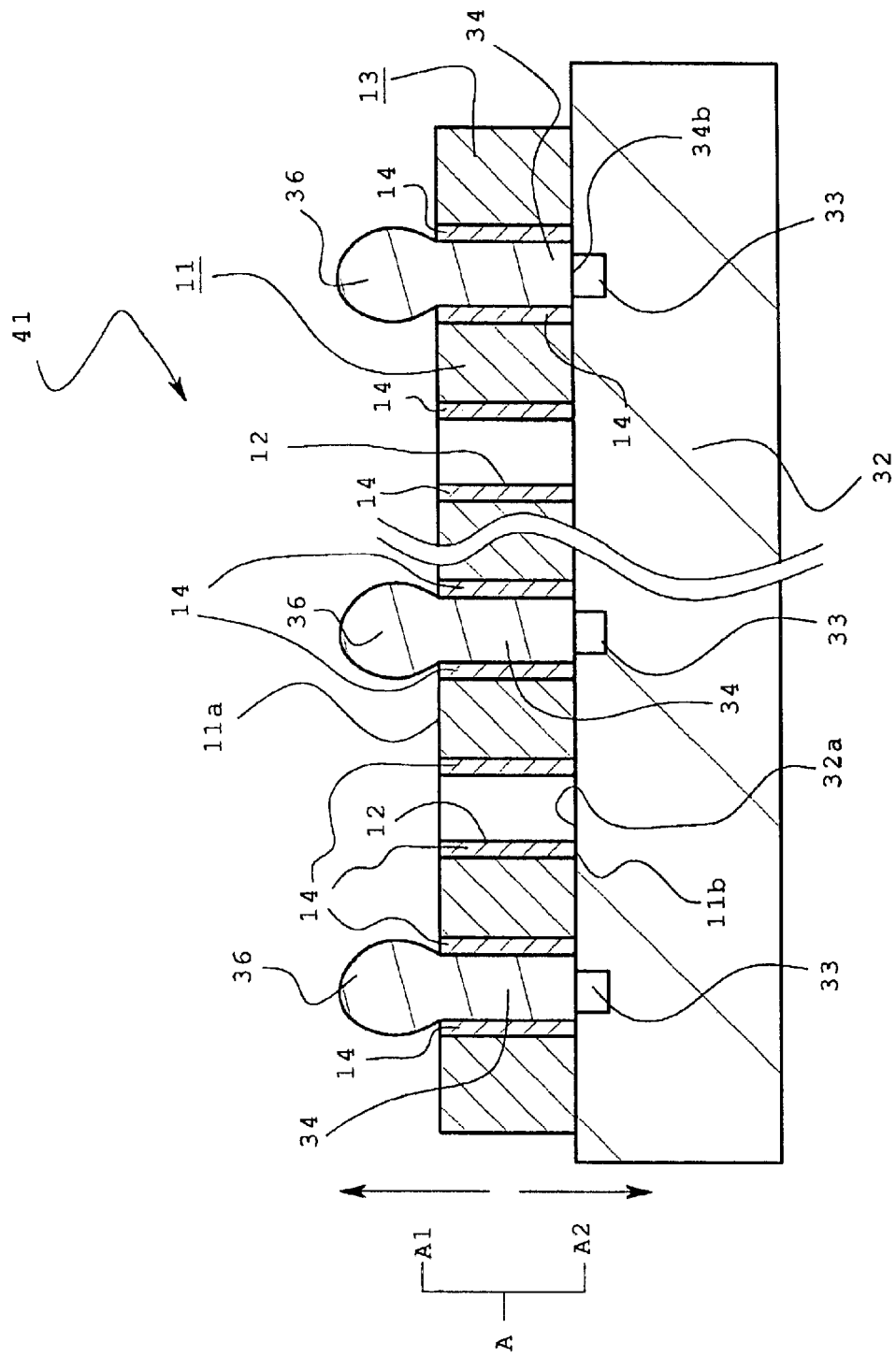
FIG. 5 shows a simplified sectional view of one preferable embodiment of a semiconductor wafer with a porous adhesive sheet 41 of the present invention.

FIG. 5 shows a simplified sectional view of one preferable embodiment of a semiconductor wafer with a porous adhesive sheet 41 of the present invention, which is on one virtual plane in parallel with the above-mentioned thickness direction A and passing a through hole 12 and an electrode 33. A semiconductor wafer with a porous adhesive sheet 41 is the same as the above-mentioned semiconductor wafer with a porous adhesive sheet 31 shown in FIG. 4 except that a porous adhesive sheet 11 shown in FIG. 2 is used instead of the porous adhesive sheet 1, wherein the parts having the same constitution as in FIG. 2 and FIG. 4 are indicated with like numbers and the explanation thereof is omitted.

In the semiconductor wafer with a porous adhesive sheet 41 shown in FIG. 5, the porous adhesive sheet 11 has an organic material layer 14. As a result, in addition to the above-mentioned respective effects of the semiconductor wafer with a porous adhesive sheet 31 of FIG. 4, a greater opening area of each through hole 12 is retained in the porous adhesive sheet 11. Therefore, a high grade semiconductor wafer with a porous adhesive sheet 41 that easily affords thermal conductivity, control of dielectric property and the like can be provided.

Figure 6:
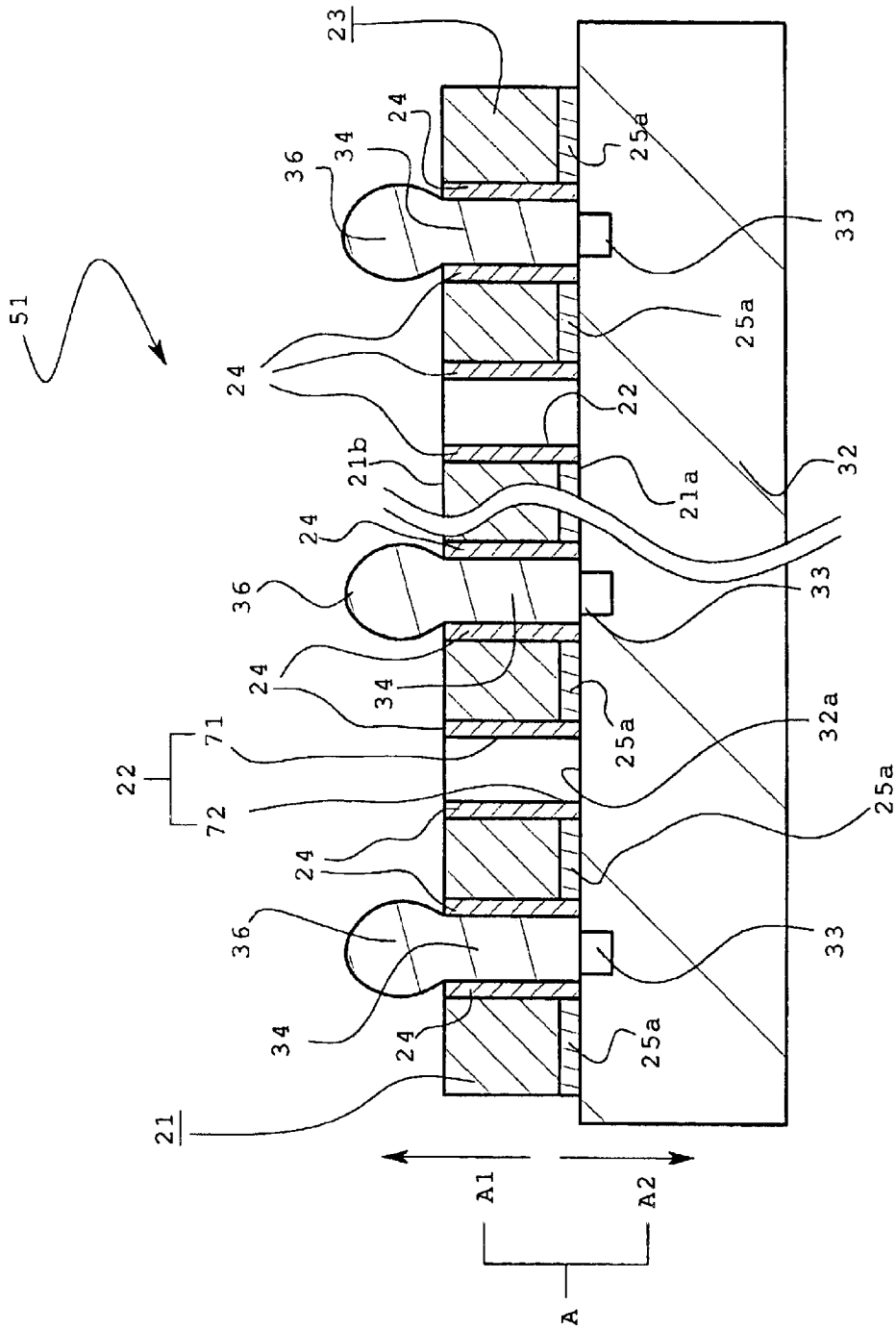
FIG. 6 shows a simplified sectional view of one preferable embodiment of a semiconductor wafer with a porous adhesive sheet 51 of the present invention.

FIG. 6 shows a simplified sectional view of one preferable embodiment of a semiconductor wafer with a porous adhesive sheet 51 of the present invention, which is on one virtual plane in parallel with the above-mentioned thickness direction A and passing a through hole 22 and an electrode 33. A semiconductor wafer with a porous adhesive sheet 51 is obtained by adhering a porous adhesive sheet 21 shown in FIG. 3 to one surface 32a of a semiconductor wafer 32 and filling the through hole 22 located on the electrode 33 with a conductive material to form a conductive part 34. The parts having the same constitution as in FIG. 3 and FIG. 5 are indicated with like numbers and the explanation thereof is omitted.

The porous adhesive sheet 21 used for the semiconductor wafer with a porous adhesive sheet 51 shown in FIG. 6 has an organic material layer 24 and an adhesive material layer 25a, and is adhered to the side where an adhesive material layer 25a is formed, or adhered such that one surface 21a of one side A1 in the thickness direction comes into general contact with the entirety of one surface 32a of the semiconductor wafer 32.

In the semiconductor wafer with a porous adhesive sheet 51 as shown in FIG. 6, the adhesive material layer 25a is formed on a surface 21a on the side of the porous adhesive sheet 21 (the aforementioned one side A1 in the thickness direction) to be adhered to a semiconductor wafer 32. As a result, in addition to the above-mentioned effects of a semiconductor wafer with a porous adhesive sheet 41 shown in FIG. 5, a firmer adhesion between the porous adhesive sheet 21 and the semiconductor wafer 32 can be provided. Consequently, a semiconductor element with a small size porous adhesive sheet obtained by dividing the semiconductor wafer with a porous adhesive sheet 51 more stably secures adhesiveness between the small size porous adhesive sheet and a semiconductor element. Since the semiconductor element has a bump 36 formed on the side opposite from the adhesion surface of the small size porous adhesive sheet to the semiconductor element (the aforementioned other side A2 in the thickness direction in FIG. 6), a strong adhesion to the circuit on the substrate is achieved, thereby decreasing the resistance value of the junction. With regard to the porous adhesive sheet having the above-mentioned adhesive material layer, when the adhesive material layer is made from a thermosetting oligomer, as in FIG. 6, the thermosetting oligomer becomes a thermoset resin having a three-dimensional structure, when it is adhered to a semiconductor wafer to produce a semiconductor wafer with a porous adhesive sheet.

A semiconductor wafer with a porous adhesive sheet of the present invention, which is equipped with a porous adhesive sheet comprising an organic material layer and an adhesive material layer, is not limited to the embodiment of FIG. 6. However, it is preferable that the adhesive material layer be realized to form only one side of the porous adhesive sheet.

In the following, the production method of the porous adhesive sheet of the present invention is shown.

The production method of the porous adhesive sheet of the present invention basically comprises a step for forming a wire-containing film for forming an adhesive organic film, wherein plural wires about parallel with each other penetrate generally along the thickness direction, and a wire-removing step for removing the wires in the organic film.

The step for forming a wire-containing film comprises, for example, the following steps.

Wires made of a metal material are covered with a material forming an organic film of the aforementioned porous adhesive sheet of the present invention. The metal materials preferable as the wire include copper, gold, aluminum and stainless steel. As the wire, a water-soluble fiber such as polyvinyl alcohol and the like may be used. The wire used has an about congruent sectional shape in each virtual plane perpendicular to the central axis. The above-mentioned sectional shape of the wire is not particularly limited and may be round, square, triangular or other shape, preferably round, more preferably circular, which is determined as appropriate according to the object of the porous adhesive sheet of the present invention.

The above-mentioned coated wire is coil wound around the core member to form a roll-like wound coil. The coil winding is done according to a known technique to produce an electromagnetic coil, such as relay, transformer and the like, and may be a spindle method wherein a core member is rotated, a flyer method wherein a wire is wound, and the like. The coil winding includes, for example, a typical method wherein one wire is wound around a core member, a method wherein plural wires are wound around a core member and the like. When plural wires are wound around a core member, the sectional shape in a virtual plane perpendicular to the central axis of each wire may be about congruent or different from each other, but preferably, about congruent.

For coil winding, an irregular winding at a long feed pitch and a high speed rotation, and a closest packing comprising solid coiling at a relatively slow speed and a feed pitch of about outer diameter of the wire, and dense stacking of the wires on the under layer wires, as in the trefoil formation, are exemplified. These modes of coil winding can be determined depending on wire diameter, cost, use and the like. From the aspect of quality, a closest packed one is preferable. The coil winding specification such as a winding width (total length of bobbin for electromagnetic coil, relating to the number of turns in one layer), a thickness (relating to the number of layers) and the like can be appropriately determined depending on the size of the objective porous adhesive sheet.

A wound coil being formed by the aforementioned coil winding or a completed wound coil after completion of the aforementioned coil winding is subjected to heating and/or pressurization. For the heating and/or pressurization, a process for applying only heating or simultaneously applying heating and pressurization is preferable because a certain tension has been already applied during the coil winding. By this process, the adjacent wires covered with a material for forming organic films are fused and/or pressed integrally to give a wound coil block.

The temperature for heating can be appropriately determined according to the material for forming an organic film. Generally, it is about softening temperature of the material −300° C., specifically about 50° C.–300° C. When the organic film is produced from a thermosetting polymer, heating at a temperature lower than the setting temperature is preferable. When pressurized, the pressure is preferably about 0.098 MPa–9.8 MPa, more preferably 0.196 MPa–1.96 MPa.

The aforementioned wound coil block is preferably formed such that the respective wires are insulated from each other. As a result, a porous adhesive sheet of the present invention can be preferably produced, wherein the wires in the wire-containing film mentioned below are insulated from each other, and when the above-mentioned through holes are filled with conductive materials, the respective conductive materials are insulated from each other.

Using a film-forming means, the aforementioned wound coil block is sliced in thin sheets to give wire-containing films. The manner of slicing can be freely determined depending on the mode of the objective porous adhesive sheet, and may be, for example, slicing without a core member, slicing with a core member, slicing with a core member, followed by separation of the core member and the like. The block is sliced such that the plane that generally perpendicularly intersects with the central axis of the wound wire is the section, and the porous adhesive sheet has a thickness D1 meeting the object. The coil winding direction of the wound coil block corresponds to the penetrating direction of each through hole, which is generally along the sheet thickness direction when it is formed into a porous adhesive sheet later.

The above-mentioned film-forming means includes any cutting means, such as a cutting tool for slicing and the like, which can be determined appropriately according to the object. For obtaining only one wire-containing film from one wound coil block, the above-mentioned film-forming means may be any of various means for cutting and grinding from the both sides of the wound coil block. Each surface of a wire-containing film may be finished as necessary.

After a step for forming a wire-containing film for forming a wire-containing film by the above-mentioned series of operations, a wire-removing step for removing the wires in the organic film is applied. To be specific, when a metal material is used as the wire, the wires in the wire-containing film are removed by acid or alkaline etching. When a water-soluble fiber is used as the wire, the wires in the wire-containing film are removed by water washing. The space left by the removal of the wires forms plural through holes running in about parallel with each other in the thickness direction of an organic film.

By these production methods, the porous adhesive sheet of the present invention is produced. For example, when a wire having any sectional shape of about congruent circle is used, the above-mentioned porous adhesive sheet 1 of the present invention as shown in FIG. 1 can be preferably produced. Different from conventional porous adhesive sheets having through holes formed by laser beam machining or photoprocessing, a porous adhesive sheet of the present invention having a through hole showing a ratio Smin/Smax (%) of the minimum area (Smin) to the maximum area (Smax) of the sections in the diameter direction of preferably 85%–100%, more preferably 90%–100%, can be preferably produced by such production method. In other words, by the above-mentioned production method, a porous adhesive sheet of the present invention, wherein the opening ratio after formation of through holes in one surface of one side in the thickness direction and that in one surface of the other side in the thickness direction are almost identical, can be preferably produced.

Moreover, in the production method of the porous adhesive sheet of the present invention, the wire used for the above-mentioned production method may be covered with an organic material having a softening temperature higher than that of the material forming the organic film by not less than 10° C., preferably not less than 30° C. Speaking in detail, for the first operation in the above-mentioned step for forming a wire-containing film, a wire is covered with an organic material having the above-mentioned softening temperature, and the organic material is covered with the above-mentioned material forming the organic film of the porous adhesive sheet of the present invention. By a series of operations similar to the above-mentioned, a wire-containing film is formed and the wires are removed from the wire-containing film. As a result, the porous adhesive sheet of the present invention 11 having the above-mentioned organic material layer 14 surrounding each through hole 12 shown in FIG. 2 can be preferably produced.

The production method of the present invention may further comprise, in a stage before the above-mentioned wire-removing step, a wire protrusion step for protruding, from the film surface, a wire end on at least one surface side of a wire-containing film and an adhesive material forming step for forming an adhesive material to fill the difference between the protrusion of the wire resulting from the wire protrusion step and the film surface. The wire protrusion step may comprise removing a part forming the surface of the organic film appropriately by etching to protrude the wire, or plating an end of the wire exposed on the wire-containing organic film to protrude the wire. In the subsequent adhesive material layer forming step, the difference between the aforementioned protrusion of the wire and the film surface is filled with an adhesive material to form an adhesive material layer. As mentioned above, the adhesive material layer is made from a thermoplastic resin or thermosetting polymer having a softening temperature lower than that of the organic film by 10° C.–30° C., or a thermosetting oligomer having a melt start temperature lower than the softening temperature of the organic film by at least 10° C., during the film forming. After the adhesive material layer forming step, the wires are removed in the above-mentioned wire-removing step.

Here, the above-mentioned difference between the protrusion of the wire and the film surface is determined to have a length that does not block the through hole when the organic film of the produced porous adhesion film is adherable. This difference corresponds to the thickness D3 of the above-mentioned adhesive material layer. This difference is determined to be, for example, 1%–10%, preferably 5%–10%, of the diameter of the wire when the aforementioned sectional shape of each wire is an about congruent circle. As a result, when the wire is formed by protrusion from only one surface of the organic film, the above-mentioned porous adhesive sheet of the present invention 21 having an adhesive material layer 25a as shown in FIG. 3 can be preferably produced.

At this point, the porous adhesive sheets of the present invention 1, 11, 21 shown in FIG. 1–FIG. 3 as preferable embodiments are preferably produced by the above-mentioned respective production methods. The methods for producing the porous adhesive sheets 1, 11, 21 are not limited by the above-mentioned production methods, but may be produced according to a production method other than those mentioned above.

A production method of a semiconductor wafer with a porous adhesive sheet of the present invention is shown in the following.

The production method of a semiconductor wafer with a porous adhesive sheet of the present invention comprises an adhesion step for adhering the porous adhesive sheet of the present invention to one surface of a semiconductor wafer having one or plural electrodes on at least one surface thereof, and a conductive part-forming step for filling at least the through holes located on an electrode of a semiconductor wafer, from among the plural through holes in a porous adhesive sheet, with a conductive material and connecting the electrode and the conductive material. The conductive part-forming step includes a step for forming a bump on an end of a through hole filled with a conductive material, which is opposite from the side joined with the electrode, after filling with the above-mentioned conductive material. In this way, a conductive part is formed.

A method for the above-mentioned adhesion step is not particularly limited and may be a conventionally known method based on, for example, autoclave, heating with press and the like or pressurization. A method for the conductive part-forming step is not particularly limited and may be a conventionally known method such as screen printing and the like.

When, for example, the porous adhesive sheet 1 shown in FIG. 1 is used as the porous adhesive sheet of the present invention, a semiconductor wafer with a porous adhesive sheet 31 of FIG. 4 is preferably produced, when the porous adhesive sheet 11 shown in FIG. 2 is used, a semiconductor wafer with a porous adhesive sheet 41 of FIG. 5 is preferably produced, and when the porous adhesive sheet 21 shown in FIG. 3 is used, a semiconductor wafer with a porous adhesive sheet 51 of FIG. 6 is preferably produced.

As a result, the semiconductor wafers having a porous adhesive sheet of the present invention 31, 41 or 51 shown in FIG. 4–FIG. 6 as preferable embodiments are preferably produced by the above-mentioned respective production methods. The methods for producing the semiconductor wafer with a porous adhesive sheet 31, 41 or 51 are not limited to the above-mentioned production methods, but may be produced according to a production method other than those mentioned above.

EXAMPLES

The present invention is explained in detail in the following by referring to Examples, which are mere examples and not to be construed as limitative.

Example 1

From a 100 μm-thick polycarbodiimide film (softening temperature: 150° C.) containing plural 30 μm diameter copper wires surrounded by a 5 μm-thick polyamideimide resin (softening temperature: 170° C.), which was an organic material layer, were removed the wires by etching to give a porous adhesive sheet of the present invention. This porous adhesive sheet was adhered to a substrate at 160° C. As a result, the opening ratio did not change before and after the adhesion and was 40%.

The opening ratio was calculated by a computer after importing images by a microscope with a CCD camera. The softening temperature was determined from the temperature of inflection point when measured by raising the temperature at 10° C./min on a tension mode of TMA (thermomechanical analysis). The results are shown in Table 1.

Example 2

From a 50 μm-thick polycarbodiimide film (softening temperature: 150° C.) containing plural 18 μm diameter copper wires surrounded by a 2 μm-thick polyamideimide resin (softening temperature; 170° C.), which was an organic material layer, were removed the wires by etching to give a porous adhesive sheet of the present invention. This porous adhesive sheet was adhered to a substrate at 160° C. As a result, the opening ratio did not change before and after the adhesion and was 60%. The results are shown in Table 1.

TABLE 1

|  | Example 1 | Example 2 |
| --- | --- | --- |
| Film forming material | Polycarbodiimide resin | Polycarbodiimide resin |
| Softening temperature | 150° C. | 150° C. |
| Film thickness | 100 μm | 50 μm |
| Diameter of through hole | 30 μm | 18 μm |
| Organic material | Polyamideimide resin | Polyamideimide resin |
| Softening temperature | 170° C. | 170° C. |
| Thickness of organic material layer | 5 μm | 2 μm |
| Opening ratio after adhesion | 40% | 60% |

Example 3

From a 150 μm-thick polycarbodiimide film (softening temperature: 150° C.) having adhesiveness and insulating property and containing plural 80 μm diameter copper wires surrounded by a 5 μm-thick polyamideimide resin (softening temperature: 170° C.), which was an organic material layer, were removed the wires by etching to give a porous adhesive sheet of the present invention. This porous adhesive sheet was adhered to a semiconductor wafer at 190° C. and 1.96 MPa (20 kgf/cm$^2$) in an autoclave. As a result, the opening ratio was 60%.

A solder was used to fill only the through hole located on an electrode of the semiconductor wafer with a porous adhesive sheet by screen printing to give a conductive part having a bump. The semiconductor wafer with a porous adhesive sheet of the present invention thus prepared was diced into 8 mm square chips, and connected to the substrate. As a result, the rate of electrical connection was 100%. The results are shown in Table 2.

TABLE 2

|  | Example 3 |
| --- | --- |
| Film forming material | Polycarbodiimide resin |
| Softening temperature | 150° C. |
| Film thickness | 150 μm |
| Diameter of through hole | 80 μm |
| Organic material | Polyamideimide resin |
| Softening temperature | 170° C. |
| Thickness of organic material layer | 5 μm |
| Opening ratio after adhesion | 60% |
| Rate of electrical connection | 100% |

Example 4

From a 70 μm-thick polycarbodiimide film (softening temperature: 150° C.) having adhesiveness and insulating property and containing plural 50 μm diameter copper wires surrounded by a 3 μm-thick polyamideimide resin (softening temperature: 170° C.), which was an organic material layer, was removed by plasma etching the organic film surface (5 μm) except the wires and the organic material layer to protrude the wires. Thereto was applied an unreacted liquid thermosetting resin composition comprising a bisphenol A type epoxy resin (Ep827) and methylhexahydrophthalic anhydride (NH-8210) in admixture at a weight ratio of 1:1, followed by heating at 100° C. for 30 min to give a 5 μm-thick adhesive material layer made from a thermosetting oligomer (melt start temperature: 120° C.). The wires were removed by alkali etching to give the porous adhesive sheet of the present invention. The prepared adhesive sheet had an opening ratio of 40%. This porous adhesive sheet was adhered to a semiconductor wafer at 120° C. and 1.96 MPa (20 kgf/cm$^2$) in an autoclave.

A solder was used to fill only the through hole located on an electrode of the semiconductor wafer with a porous adhesive sheet by screen printing to give a conductive part having a bump. The semiconductor wafer with a porous adhesive sheet of the present invention thus prepared was diced into 8 mm square chips, and adhered to the substrate. As a result, the rate of electrical connection was 100%.

The opening ratio after adhesion was 40%, and did not change before and after the adhesion. The results are shown in

TABLE 3

|  | Example 4 |
| --- | --- |
| Film forming material | Polycarbodiimide resin |

TABLE 3-continued

| | Example 4 |
|---|---|
| Softening temperature | 150° C. |
| Film thickness | 70 μm |
| Diameter of through hole | 50 μm |
| Organic material | Polyamideimide resin |
| Softening temperature | 170° C. |
| Thickness of organic material layer | 3 μm |
| Adhesive material | Epoxy resin oligomer |
| Melt start temperature | 120° C. |
| Thickness of adhesive material layer | 5 μm |
| Opening ratio after adhesion | 40% |
| Rate of electrical connection | 100% |

Comparative Example

A porous adhesive sheet obtained by laser beam machining a 100 μm-thick polyimide film to have through holes having a diameter on the film surface side of 120 μm, on the back of the film of 60 μm and an average of 90 μm was adhered to a semiconductor wafer in an autoclave. After adhesion, a conductive part having a bump was formed by screen printing on the film surface side in the same manner as in Example 4.

By an appearance examination, some connected bumps were observed.

EFFECT OF THE INVENTION

As is clear from the above explanation, the present invention provides a porous adhesive sheet having a number of fine through holes, each having a regular shape and being difficult to close when an organic film is adherable, and a preferable production method thereof, and a semiconductor wafer with a porous adhesive sheet, which is suitable for bare chip mounting and a production method thereof.

This application is based on application nos. 2000-005084 and 2000-243398 filed in Japan, the contents of which are incorporated hereinto by reference.

What is claimed is:

1. A porous adhesive sheet having a plurality of through holes running in about parallel with each other in the thickness direction of an organic film, wherein each through hole has an about congruent section in the diameter direction from one opening thereof to the other opening thereof, is not filled and is surrounded throughout its entire length in the thickness direction of the adhesive sheet by an organic material layer having a softening temperature higher by 10° C. or more than the softening temperature of the organic film.

2. The porous adhesive sheet of claim 1, wherein the through hole maintains its opening even after adhesion.

3. The porous adhesive sheet of claim 1, which comprises, on at least one side of the organic film, an adhesive material layer having the entirety or a part of the through holes present in the organic film and plural communication holes communicating in said thickness direction, wherein the adhesive material layer is composed of a thermoplastic resin or thermosetting polymer having a softening temperature lower than that of the organic film by 10° C.–30° C., and has not to close up the through holes in the organic film in an adhesion state.

4. The porous adhesive sheet of claim 1, which comprises, on at least one side of the organic film, an adhesive material layer having the entirety or a part of the through holes present in the organic film and plural communication holes communicating in said thickness direction, wherein the adhesive material layer is composed of a thermosetting oligomer having a melt start temperature lower than the softening temperature of the organic film by not less than 10° C., and has such thickness as not to close up the through holes in the organic film in an adhesion state.

\* \* \* \* \*